United States Patent [19]

Feron

[11] Patent Number: 4,945,304

[45] Date of Patent: Jul. 31, 1990

[54] DEVICE FOR MONITORING THE UNBALANCE OF THE ELECTRIC POWER DEMANDED

[75] Inventor: Paul Feron, Toulouse, France

[73] Assignee: Service National Electricite de France, France

[21] Appl. No.: 391,177

[22] Filed: Aug. 9, 1989

[30] Foreign Application Priority Data

Aug. 9, 1988 [FR] France .................. 88 10739

[51] Int. Cl.[5] .......................................... G01R 25/00
[52] U.S. Cl. ..................................... 324/107; 324/86; 324/140 R; 324/126; 324/127
[58] Field of Search .................... 324/140 R, 107, 108, 324/141, 86; 361/76, 85, 86, 87; 340/662, 664; 329/508, 512, 500, 127, 126

[56] References Cited

U.S. PATENT DOCUMENTS

| 4,423,374 | 12/1983 | Hansen, Jr. | 324/140 R |
| 4,600,961 | 7/1986 | Bishop | 361/76 |
| 4,802,053 | 1/1989 | Wojtak et al. | 361/85 |
| 4,819,124 | 4/1985 | Arinobu | 361/87 |

FOREIGN PATENT DOCUMENTS 2206507 6/1974 France .
2557391 6/1985 France .
5759175 7/1982 Japan .

Primary Examiner—Reinhard J. Eisenzopf
Assistant Examiner—Vinh P. Nguyen
Attorney, Agent, or Firm—Hayes, Soloway, Hennessey & Hage

[57] ABSTRACT

A device for monitoring the unbalance of the electric power demanded on the conductive lines of an alternating current network of a three-phase internal installation. The device applies to all networks or three-phase installations which serve single-phase type devices in terms of variable number and power.

5 Claims, 1 Drawing Sheet

DEVICE FOR MONITORING THE UNBALANCE OF THE ELECTRIC POWER DEMANDED

FIELD OF THE INVENTION

The present invention concerns a device for monitoring the unbalance of the electric power demanded on the conductive lines of an alternating network or a three-phase internal installation. It applies to all networks or three-phase installations which serve single-phase type devices in terms of variable number and power.

BACKGROUND OF THE INVENTION

1. Field of the Invention

In electric networks, which serve single-phase devices, significant unbalances of the electric power demanded may appear when the value of the current circulating in one of the phase lines of this network becomes far more significant than the values of currents circulating in the other phase lines. For example, this could be the case when the network feeds single-phase devices and when most of these devices consume a high-value current at a determined time on one of the network phases. When this unbalance becomes too great, any protective devices installed to provide against excess loads may function, and the potential differences or line drops could, for one section of users and materials, reach prohibitive values, whilst a better balanced state could enable these drawbacks to be overcome.

2. Description of the Prior Art

There currently exists no simple device able to easily control an unbalance of the electric power demanded on the lines of various phases of an electric or a three-phase alternating network.

The absence of this simple device is detrimental to electricity distributors since, without knowing the maximum intensity demanded on each phase line, they are unable to limit this maximum intensity via a more judicious distribution of the loads or devices connected to each phase line.

As a result, the cost of electric energy distribution, which includes monitoring, fault clearance, maintenance and installation modernization costs, as well as costs for the interruption of services and electric losses due to voltage irregularity, could be reduced via a better awareness of the rate of the unbalance of the demanded electric power.

SUMMARY OF THE INVENTION

The object of the present invention is to overcome these drawbacks and in particular to embody a device to detect the unbalance of the electric power demanded on the conductive lines of a network or three-phase electric installation which, by virtue of an increased awareness of the unbalance of this network, makes it possible to more effectively distribute the loads on the various phase lines of the latter; thus distribution cut-offs, due to an excess intensity in one of the phase lines, are avoided by means of more effective distribution, especially single-phase devices connected to this network, so as to obtain a more effective distribution of the electric power demanded on each phase line.

It ought to be mentioned that the unbalance of the power demanded on the network may be constant. This type of unbalance is due to the installation itself, for example, when most of the use devices are connected to a particular phase. It is then possible to qualify this unbalance as being structural.

This unbalance may also be transient or sometimes affect one phase, and at another moment affect another phase. This is then qualified as being non-structural.

If the incidents which occur are regular and always concern the same phase, this will involve a cyclic non-structural unbalance. If, on the other hand, these incidents cannot be anticipated, either as regards the time or phase, this shall involve a random non-structural unbalance.

Structural unbalances can be corrected by altering the connections on the installation so as to permanently ensure better distribution of the power demanded on the phase lines.

Cyclic non-structural unbalances may be corrected by modifying the programming (automatic or manual) for load adjusting devices.

Random non-structural unbalances may only be corrected by power adapters and/or automatic equalizers; however, the connection of these adaptors to the network may merely result in a better awareness of the unbalance and thus the existence of the analysis equipment of the latter.

As shall be seen later in detail, the monitoring device of the invention makes it possible to detect any unbalance of the electric power demanded on the conductive lines of the various phases of a network or an alternating installation by measuring or calculating the value of the current in the neutral line and by carrying out the ratio of this value to the sum of the values of the currents in each of the phase lines. This ratio, which may also be qualified with unbalance rates, may vary between 0 and 1. This ratio has the value 0 when the value of the intensity of the current in the neutral line is nil and has the value 1 when the entire power is demanded on a single phase. The value of the current in the center is then equal to the intensity which passes through this phase, the current in the other two phases being nil.

In fact, the limit value of the ratio or unbalance rate can be fixed at $0.5+\epsilon$ which must not be exceeded so that the network functions in acceptable unbalance conditions. In fact for this value, the intensity of the current in one of the phases is still greater than the sum of the intensities of the currents of two other phases. But the invention is adaptable to any other threshold level it is given. The rates containing the most information are, however, greater than or equal to $0.5+\epsilon$.

The object of the invention is to provide a device for monitoring the unbalance of the electric power demanded on the conductive lines of a network or three-phase alternating electrical installation, this network comprising one line for each phase and a neutral current return line, said device being characterized in that it comprises means for measuring currents connected to the lines of the network so as to supply on respective outputs the numerical values of the currents circulating in these lines, means to calculate the value of the ratio at a given instant of the value of the current circulating in the neutral line to the sum of the values of the currents circulating in the phase lines, a numerical signal representative of the value of this ratio being supplied on one output of the calculation means, first indication means connected to the output of the calculation means so as to indicate when the value of said ratio exceeds a predetermined unbalance threshold, and second indication means connected to the outputs of the means for measuring the currents in the phase lines and to one output of the first indication means so as to localize the phase line in which a current is then circulating with a value greater than each of the values of the currents circulating in the other phase lines, the localized line being the one which has caused the unbalance. The calculation means only control the indication of a result when the power demanded exceeds a threshold value P equal to X%, for example, 75% of the power assigned to the network or the installation. In fact, it is pointless to follow up the unbalance of a slightly unequalized installation. The total power threshold from which the unbalance rate is stored is proposed at 75%, but it is possible to legitimately consider a value able to be adjusted between 50 and 90%.

According to one characteristic, the first indication means comprise two threshold detectors, power and unbalance, connected to the output of the calculation means, one output of the unbalance detector being connected to an indicator which changes state as soon as said predetermined threshold is exceeded.

According to a further characteristic, the third indication means include a comparator having inputs connected to the outputs of the means for measuring the values of the currents in the phase lines so as to determine at each instant the phase line in which a current is circulating, the value of said current being greater than the value of the currents circulating in the other phase lines, this comparator having outputs respectively corresponding to the phase lines, a coded signal, corresponding to the line in which the current with the highest value is circulating, being supplied on the corresponding output of the comparator, a selective logic circuit having inputs connected to the outputs of the comparator and to the output of the threshold detectors, this logic circuit having outputs corresponding to the phase lines, these outputs being respectively connected to indicators, this logic circuit selecting, once said predetermined threshold is exceeded, the indicator corresponding to the line in which the higher value current is circulating.

According to another characteristic, the device comprises recording means connected to the output of the calculation means and to the output of the threshold detector so as to record the values of said ratios each time the predetermined threshold is exceeded.

According to a further characteristic, the recording means are connected to the outputs of the means for measuring the values of the currents in the phase lines and to the outputs of the selective logic circuit so as to record, on each occasion the predetermined threshold is exceeded, the upper value of the current in the phase line having caused the unbalance.

DETAILED DESCRIPTION OF THE PREFERRED EMBODIMENTS

Figure 1:
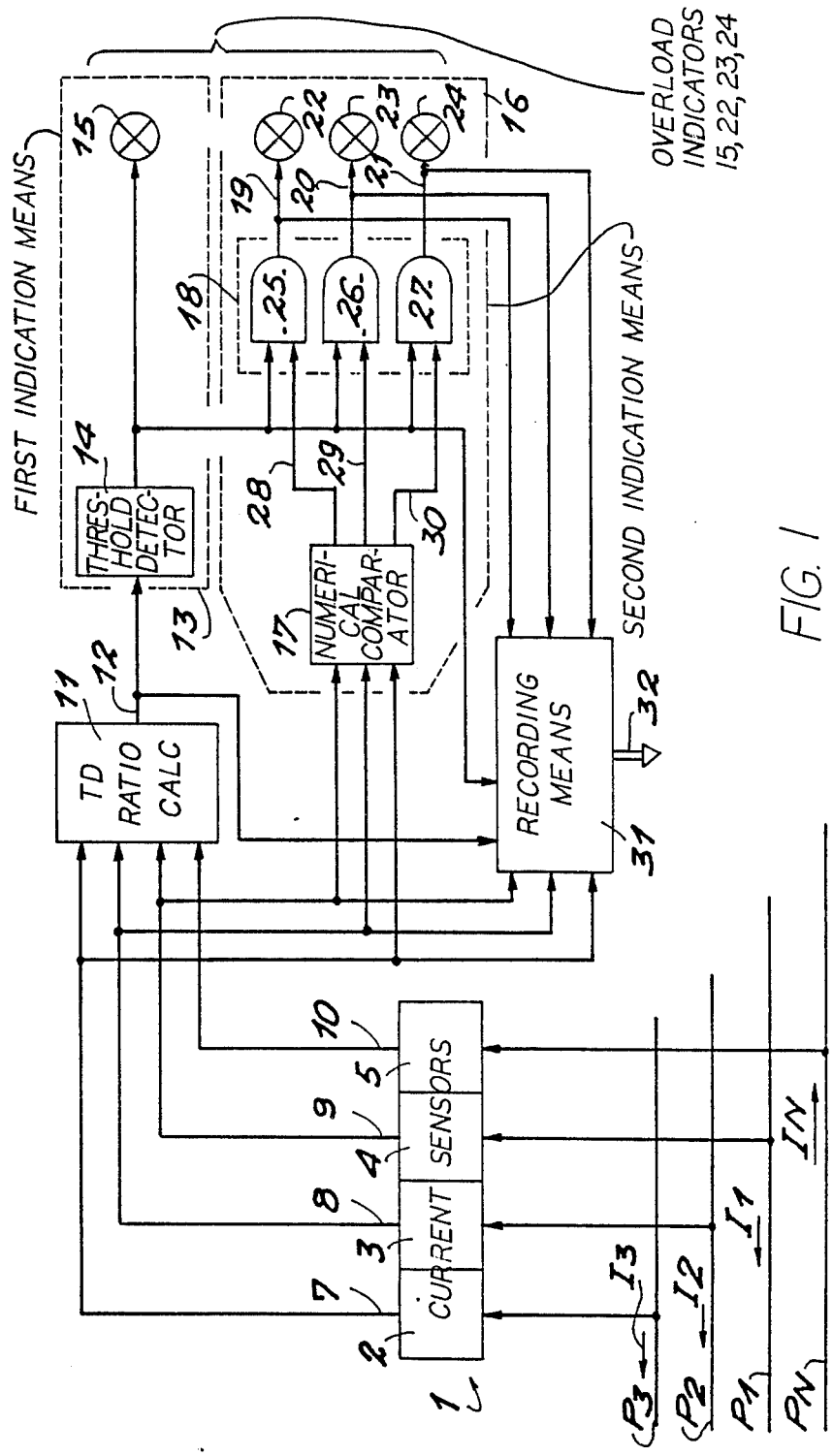
FIG. 1, functional block diagram of the invention, a device for monitoring the unbalance of the electrical power demanded.

The device comprises means 1 to measure the currents, connected to the lines P1, P2, P3, PN of the network, so as to supply on outputs the numerical values of the currents circulating in these lines. These measuring means may, for example, be implemented by numerical clamp-on probes, respectively represented as 2, 3, 4, 5 on the figure. There may also be current or voltage detectors already in place for signaling the thermal protective system of circuit breakers. These probes supply on their respective outputs 7, 8, 9, 10 the numerical values of the currents circulating in the corresponding lines P3, P2, P1, PN. As PN can be calculated from P3, P2, P1, it is often an advantage to replace the value of the current in the line PN by its calculated value.

The device also includes means 11 to calculate the value of the ratio TD, at a specific instant of the value of the current IN circulating in the neutral line PN, to the sum $I1+I2+I3$ of the values of the currents I1, I2, I3 circulating in the phase lines P1, P2, P3.

This value TD, equal to $IN/I1+I2+I3$, is modified with the ratio or unbalance rate of the network. It is supplied in the form of a numerical signal on an output 12 of the calculation means 11.

The device also includes first indication means 13 connected to the output 12 of the calculation means 11 so as to indicate when the value of the ratio TD of the unbalance of the network exceeds a predetermined unbalance threshold. As indicated earlier, this limit value may be fixed at $0.5+\epsilon$. The first indication means 13 include, for example, a threshold detector 14 connected to the output 12 of the calculation means 11. One output of this detector is connected to an indicator 15 which changes state as soon as the predetermined unbalance threshold TD is exceeded. The indicator 15 may be a lamp or another electromechanical or acoustic indication device.

The device also comprises second indication means 16 connected to the outputs 7, 8, 9 of the means 2, 3, 4 for measuring the values of the currents in the phase lines and to one output of the first indication means 13. In fact, this output is the output of the threshold detector 14. As shall be seen later in detail, this second indication device makes it possible to localize the phase line in which a current is circulating with a value greater than each of the values of the currents circulating in the other phase lines. The line localized is in fact the one whose volume ought to be reduced with respect to the other phases.

The second indication means 16 include a numerical comparator 17 having inputs connected to the outputs 7, 8, 9 of the means for measuring the values of the currents in the phase lines; this comparator makes it possible to determine at each instant the phase line in which a current is circulating, the value of said current being greater than the value of the currents circulating in the other phase lines. The numerical comparator is not described here in detail. It may be implemented by a group of comparators; it supplies coded signals on outputs. In the example in question where three values of currents are to be compared, the comparator includes three outputs. A particular coded signal is supplied on the output of the comparator corresponding to the phase line in which the current is circulating having the largest value. This coded signal may, for example, be a logic level 1 signal appearing on the output in question, the other outputs supplying logic level 0 signals.

The second indication means 16 also comprise a selective logic circuit 18 having inputs connected to the outputs of the comparator 17 and to the output of the threshold detector 14. This selective logic circuit has outputs respectively corresponding to the phase lines. These outputs are represented as 19, 20 and 21 on FIG. 1. They are respectively connected to electric or electromechanical indicators 22, 23, 24. As soon as the predetermined threshold is exceeded, the selective logic circuit 18 selects the indicator corresponding to the line in which the current with the highest value is circulating.

The selective logic circuit may be implemented, for example in the case of a three-phase network, by 3 AND type gates 25, 26, 27. These gates each include two inputs. The first inputs of these gates are respectively connected to the outputs 28, 29, 30 of the comparator 17, whereas the second inputs of these gates are connected to the output of the threshold detector 14.

The device just described functions as follows: if an unbalance threshold is exceeded when the total power demanded is greater than a certain level, the indicator 15 of the first indication means 13 changes state. This indicator may, for example, be a lamp which is lit. If an unbalance threshold is exceeded, this is because a much larger current is circulating in one of the phase lines than in the other lines, this line causing the unbalance of the power demanded being required to be localized. If the most intense current is the current circulating in the line P1, the comparator 17 supplies on its output 30 corresponding to this line a logic level 1 signal. In fact, this comparator localizes the highest numerical value supplied by the output 9 of the means 4 for measuring the current I1 circulating in the line P1. This logic level 1 signal is applied to the second input of the gate ET 27, whereas a logic level signal 1 is applied to the first input of this gate via the output of the threshold detector 14. When the unbalance ratio TD ($=0.5+\epsilon$) in the example in question is exceeded, the outputs 28, 29 of the comparator supply a logic level 0 signal. The AND gate 27 thus supplies on its output 21 a logic level 1 signal provoking the change of state of the electromechanical, electric or sound indicator 24, such as a lamp. The other indicators corresponding to the lines P2 and P3 do not change state.

Thus, the device makes it possible to detect that a predetermined unbalance rate or ratio has been exceeded when the total power P1+P2+P3 exceeds a certain power threshold value P equal, for example, to 75% of the value assigned, and also makes it possible to localize the phase line in which a current is circulating whose value is greater than the value of the currents circulating in the other phase lines, the excess intensity in this line having caused the unbalance of the power demanded on the network.

The indication of the existence of an unbalance concerning a phase is retained as long as the device has not been manually reset. But throughout the period for connecting the detector, investigations are carried out and it is not impossible that on a final reading it is established that two or three phases have at any particular moment been the ones most charged in an unbalance situation.

If a single phase is involved, a structural unbalance, a single recommendation consists of providing a transfer of one quarter of the load of the first phase onto each of the two other phases.

If two phases are involved, it is possible to transfer a third of the load of each phase onto the third phase, but this solution frequently requires resorting to an unbalance analyzer which is solely able to indicate if the phenomenon is structural or non-structural.

Finally, if the three phases are involved at any moment, this certainly occurs in the presence of non-structural unbalances. Analysis indicates whether they be cyclic or random and suggests the corrective steps to be taken. If there is no alternative, this would require contemplating increasing the power of the feed transformer or the subscribed power of the standing charge of the user.

The device also includes recording means 31 connected to the output 12 of the calculation means 11 and to the output of the threshold detector 14 so as to record the values of the unbalance ratios each time the predetermined threshold is exceeded. These recording means may be provided with a clock (not shown) so as to also record the moment the unbalance occurs with respect to a reference instant.

The recording means 31 may also be connected to the outputs 7, 8, 9 of the means 1 for measuring the current values in the phase lines P1, P2, P3 and to the outputs 19, 20, 21 of the selective logic circuit 18. These linkings make it possible to record, each time the predetermined threshold is exceeded, the higher value of the current in the phase line which has provoked the unbalance. The recording instant of this value may itself be recorded, as indicated previously.

The recording means 31 may be connected via a reading output 32 to means (not shown) for displaying the various values recorded over a period of time. This display makes it possible, for example, to study the phase lines provoking the greatest unbalances, as well as the structural, cyclic conjunctural or random nature of the unbalances. As indicated earlier, this study makes it possible to eliminate the unbalance of the power demanded, either by connecting in a different way the devices fed by the network, or by modifying the characteristics of the high/low voltage transformer feeding these devices. For example, this device makes it possible to avoid using transformers whose power is excessive. By means of an improved distribution of the devices fed by the various phase lines of the network, this makes it possible to also avoid any interruption of this network on account of too great an unbalance on one of the phase lines of the latter. Thus, this allows for substantial savings to be made when exploiting an electric multiphase alternating network.

Measures have been taken to avoid regarding a network or installation as mismatching which has temporarily been regarded as such.

Similarly, when the network or installation is protected by a circuit breaker, means are provided to indicate whether the possible functioning of this circuit breaker occurs in the out-of-balance regime or otherwise.

What is claimed is:

1. A device to monitor the unbalance of the electric power demanded on the conductive lines of a network or three-phase alternating electrical installation, said network including one line for each phase and a return current neutral line, wherein said device comprises a means to measure the currents connected to the lines of the network so as to supply on respective outputs the numerical values of the currents circulating in these lines, a means to calculate the value of the ratio, at a given instant of the value of the current circulating in the neutral line, to the sum of the values of the currents circulating in the phase lines, a numerical signal representative of the value of the ratio being supplied on one output of the calculation means, a first indication means connected to the output of the calculation means so as to indicate when the value of said ratio exceeds a predetermined unbalance threshold, while the power demanded at the same moment itself is greater than a certain proportion of the power assigned, and a second indication means connected to the outputs of the means for measuring the currents in the phase lines and to one output of the first indication means so as to localize the phase line in which a current is circulating whose value is greater than each of the values of the currents circulating in the other phase lines, the localized line being the one which has caused the unbalance.

2. The device according to claim 1, wherein the first indication means comprises a threshold detector connected to the output of the calculation means, one output of the detector being connected to a first indicator which changes state as soon as said predetermined threshold is exceeded.

3. The device according to claim 2, wherein the second indication means comprises a comparator having inputs connected to the outputs of the means for measuring the values of the currents in the phase lines, so as to determine at each instant the phase line in which a current is circulating whose value is greater than the values of the currents circulating in the other phase lines, the comparator having outputs respectively corresponding to the phase lines, a coded signal, corresponding to the line in which a current of greater value is circulating, being supplied on the corresponding output of the comparator, a selective logic circuit having inputs connected to the outputs of the comparator and to the output of the threshold detector, the selective logic circuit having outputs corresponding to the phase lines, said outputs respectively being connected to a plurality of second indicators, the logic circuit, as soon as said predetermined threshold is exceeded, selecting the indicator corresponding to the line in which the higher value is circulating.

4. The device according to claim 3, and further comprising a recording means connected to the output of the calculation means and to the output of the threshold detector so as to record the values of said ratios each time the predetermined threshold is exceeded.

5. The device according to claim 4, wherein the recording means are connected to the outputs of the means for measuring the values of the currents in the phase lines, and to the outputs of the selective logic circuit so as to record, on each occasion the predetermined threshold is exceeded, the upper value of the current in the phase line having caused this unbalance.

* * * * *